United States Patent
Tanimizu et al.

(10) Patent No.: US 9,659,702 B2
(45) Date of Patent: May 23, 2017

(54) OUTPUT NOISE REDUCING DEVICE

(71) Applicant: KITAGAWA INDUSTRIES CO., LTD., Inazawa-shi, Aichi-ken (JP)

(72) Inventors: Tomokazu Tanimizu, Nagoya (JP); Kazushige Ueno, Gifu (JP); Katsuyuki Morita, Ama-gun (JP); Teruaki Yuoka, Komaki (JP)

(73) Assignee: KITAGAWA INDUSTRIES CO., LTD., Aichi (JP)

( * ) Notice: Subject to any disclaimer, the term of this patent is extended or adjusted under 35 U.S.C. 154(b) by 0 days.

(21) Appl. No.: 14/904,582

(22) PCT Filed: Aug. 6, 2014

(86) PCT No.: PCT/JP2014/070690
§ 371 (c)(1),
(2) Date: Jan. 12, 2016

(87) PCT Pub. No.: WO2015/020077
PCT Pub. Date: Feb. 12, 2015

(65) Prior Publication Data
US 2016/0148745 A1    May 26, 2016

(30) Foreign Application Priority Data

Aug. 9, 2013  (JP) .................................. 2013-166620
Aug. 30, 2013 (JP) .................................. 2013-179063

(51) Int. Cl.
H04B 3/28       (2006.01)
H01F 27/24      (2006.01)
(Continued)

(52) U.S. Cl.
CPC ............. *H01F 27/24* (2013.01); *H01F 27/29* (2013.01); *H02M 1/126* (2013.01); *H02M 1/44* (2013.01); *H02M 3/00* (2013.01); *H05K 5/04* (2013.01)

(58) Field of Classification Search
CPC ........ H01F 27/24; H01F 27/29; H02M 1/126; H02M 1/44; H02M 3/00; H05K 5/04
(Continued)

(56) References Cited

U.S. PATENT DOCUMENTS 7,961,065 B2 * 6/2011 Kobayashi ............ H01F 17/045
                                                333/172
8,994,475 B2 * 3/2015 Nishioka .............. H03H 7/0115
                                                333/181
(Continued)

FOREIGN PATENT DOCUMENTS

JP  2006-269467 A   10/2006
JP  2009-240037 A   10/2009
(Continued)

OTHER PUBLICATIONS

Feb. 9, 2016 International Preliminary Report on Patentability issued in International Patent Application No. PCT/JP2014/070690.
(Continued)

*Primary Examiner* — Robert Pascal
*Assistant Examiner* — Kimberly Glenn
(74) *Attorney, Agent, or Firm* — Oliff PLC

(57) ABSTRACT

One end of a bus bar for leading an output voltage output from a switching power supply to the outside is a connection terminal connected to an output end associated with the switching power supply, while the other end is an output terminal VO. A ferrite core has a through-hole through which the bus bar is disposed. Electromagnetic coupling from the switching power supply is suppressed between the
(Continued)

output terminal VO of the bus bar and at least a part of the ferrite core on the output terminal VO side along the bus bar. In this way, electromagnetic coupling of a part of a choke coil including the ferrite core with the bus bar penetrating therethrough on the output terminal VO side and the switching power supply is suppressed, whereby propagation of noise to the output terminal VO is suppressed.

7 Claims, 5 Drawing Sheets

(51) Int. Cl.
  *H02M 1/12* (2006.01)
  *H02M 1/44* (2007.01)
  *H02M 3/00* (2006.01)
  *H01F 27/29* (2006.01)
  *H05K 5/04* (2006.01)

(58) Field of Classification Search
  USPC ............ 333/12, 167, 181, 185; 361/811
  See application file for complete search history.

(56) References Cited

U.S. PATENT DOCUMENTS

| | | | |
|---|---|---|---|
| 2012/0081194 A1* | 4/2012 | Nishioka | ............... H01F 27/40 333/185 |
| 2014/0240946 A1 | 8/2014 | Fukumasu et al. | |

FOREIGN PATENT DOCUMENTS

| | | |
|---|---|---|
| JP | 2011-083080 A | 4/2011 |
| JP | 2012-210002 A | 10/2012 |
| JP | 2013-099057 A | 5/2013 |

OTHER PUBLICATIONS

Dec. 9, 2014 Search Report issued in International Patent Application No. PCT/JP2014/070690.

Jan. 19, 2017 Office Action issued in Korean Patent Application No. 10-2016-7002266.

Apr. 4, 2017 Office Action issued in Japanese Patent Application No. 2013-179063.

* cited by examiner

OUTPUT NOISE REDUCING DEVICE

TECHNICAL FIELD

A technique disclosed in the present application relates to an output noise reducing device for reducing noise that becomes mixed in an output signal. In particular, a technique disclosed in the present application relates to a noise reducing device including an inductance element inserted in a signal path of the output signal.

BACKGROUND ART

Conventionally, in an output voltage or output signal output from a switching power supply or other electronic equipment, noise of the operating frequency of the electronic equipment and the like and its harmonic frequencies may become mixed. Because the noise may adversely affect external electronic equipment, it is necessary to reduce the noise as needed. When an output voltage of a predetermined voltage value is output by the switching operation of a power transistor in the switching power supply, noise of the switching frequency and its harmonic frequencies may be generated by the switching of current paths as the power transistor is turned on and off, depending on the output rating. It is conceivable that the noise may become superposed on the output voltage and be carried to the external electronic equipment. Particularly, when the switching power supply is mounted in an automobile, the noise of the switching frequency and its harmonic frequencies may become superposed on an audio signal and the like, depending on the switching frequency. As a result, the problem of adverse influence on listening or viewing, or the so-called radio noise, may be caused. In order to reduce the noise, an output noise reducing device equipped with an inductance element, such as a choke coil, may be inserted in the output path of the output voltage and the like (such as in Patent Literature 1).

CITATION LIST

Patent Literature

Patent Literature 1: JP-A-2012-210002

SUMMARY OF THE INVENTION

Problems to be Solved

In the automotive field, the switching power supply and other electronic equipment described above need to be able to ensure reliability and the like with respect to harsh surrounding environments in terms of, e.g., vibrations, dust, and temperature. From this viewpoint, the electronic equipment may be compartmentalized on a base plate or an electronic circuit board. Alternatively, the electronic equipment may be housed in a metal casing of aluminum and the like, where the mounted components are stored in isolation from the outside. In this case, reliability and the like are similarly required to be ensured for the output noise reducing device for noise reduction purpose. Accordingly, the output noise reducing device is also typically mounted in a metal casing.

However, in the metal casing, the diversion of noise due to electromagnetic coupling such as capacitive coupling and inductive coupling of circuit elements or wiring and of noise from the ground potential are not necessarily sufficiently suppressed. Particularly, the power transistor that performs switching operation as a major source of noise and the output terminals are close to each other in a circuit configuration. Accordingly, the power transistor and the output terminals may be mounted at positions close to each other. As a result, the noise generated by the switching operation of the power transistor could diverge and reach the output terminals without going through the intended output path of the output noise reducing device with its noise reduction function. Such diversion of noise is dependent on the electromagnetic coupling, such as capacitive coupling and inductive coupling, due to parasitic capacitive components and inductive components and the like; the routing of grounding wiring; and their mutual arrangement. Accordingly, even if the output noise reducing device is provided in the output path to the output terminals, the noise can enter the output terminals without passing through the output noise reducing device, leading to the problem of not being able to sufficiently reduce noise.

The present application proposes a technique in view of the above problem, and an object of the technique is to provide an output noise reducing device capable of preventing the propagation of noise from electronic equipment housed in a metal casing without passing through the intended signal path by electromagnetic coupling or due to diversion from ground potential.

Solution to the Problems

The output noise reducing device according to the technology disclosed in the present application is a device that reduces noise that becomes mixed in an output signal output from electronic equipment housed in a metal casing. The device is provided with an output line and a magnetic material core. The output line is a line for leading the output signal output from the electronic equipment to the outside. One end of the output line is a connection terminal connected to an output end associated with the electronic equipment, while the other end is an output terminal. The magnetic material core includes a through-hole through which the output line is disposed. Electromagnetic coupling from the electronic equipment is suppressed from the output terminal on the other end of the output line to at least a part of the magnetic material core on the output terminal side along the output line.

In this way, electromagnetic coupling is suppressed at least between an output terminal-side part of the inductance element, which includes the magnetic material core with the output line penetrating therethrough and which functions as a choke coil, and the electronic equipment. The electromagnetic coupling herein refers to the propagation of noise (electromagnetic noise) via a space, including capacitive coupling and inductive coupling. Accordingly, the noise generated by the operation of the electronic equipment does not become mixed with at least the part of the inductance element on the output terminal side. The influence of the electromagnetic noise due to electromagnetic coupling is suppressed from propagating to the output terminal, whereby an output signal with reduced noise is output.

Effects of the Invention

According to the output noise reducing device of the technology disclosed in the present application, electromagnetic coupling of at least the output terminal side part of the magnetic material core and the electronic equipment is suppressed, whereby the noise from the electronic equipment that becomes mixed in the output signal can be reduced.

DESCRIPTION OF EMBODIMENTS

Figure 1:
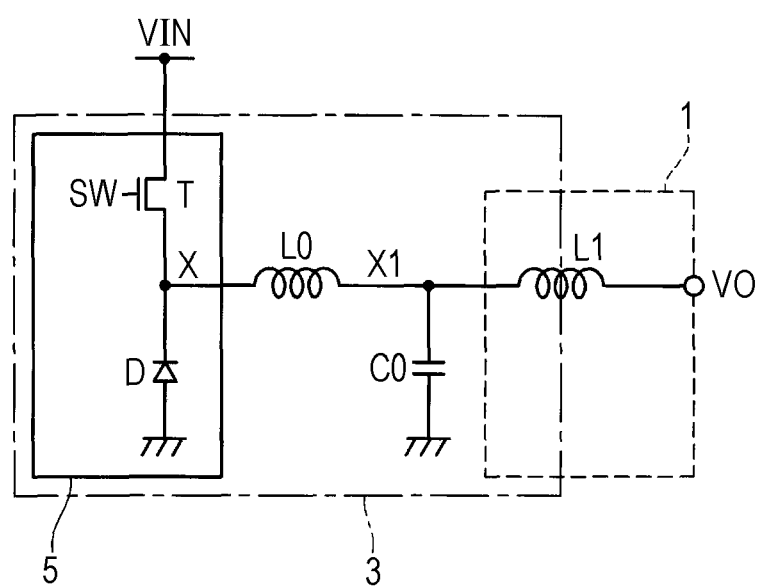
FIG. 1 is a circuit diagram of a choke coil module, as an example of a noise reducing device according to the first embodiment, applied in a switching power supply.

FIG. 1 is a circuit diagram of a first embodiment according to the present application, showing a choke coil module 1 as an example of a noise reducing device connected in a stage subsequent to a switching power supply 5. The switching power supply 5 is housed in a metal casing 3 of die-cast aluminum and the like. With reference to FIG. 1, the electrical operation and effect of the choke coil module 1 will be described.

The switching power supply 5 is a vehicle-mounted power supply, for example. More specifically, the switching power supply 5 is a step-down type of switching power supply that supplies electric power to an accessory battery (not shown) by stepping down a voltage value from a main battery (not shown) of a hybrid vehicle, an electric automobile and the like. The main battery supplies a power supply voltage VIN (such as DC 244 V) for the drive system of the vehicle. The accessory battery supplies a power supply voltage (such as DC 14 V) to electric equipment in the vehicle, such as audio equipment, air-conditioning equipment, and illumination equipment.

The switching power supply 5 takes out electric power from a connection point X of a power transistor T and a diode D connected in series between the power supply voltage VIN and ground potential GND. Specifically, the power transistor T is repeatedly on-off controlled at a predetermined switching frequency f by a switching signal SW applied to the gate terminal of the power transistor T. In an on-period of the power transistor T, a current path is formed from the power supply voltage VIN to a coil L0, whereby electromagnetic energy is accumulated in the coil L0. In an off-period of the power transistor T, the accumulated energy is released to the output side including an output capacitor C0 by a current from the diode D. In the switching power supply 5, these operations are repeated at the predetermined switching frequency f.

In the switching power supply 5, a current corresponding to load current flows toward the connection point X through the power transistor T or the diode D alternately at the switching frequency f. As a result, at the power supply voltage VIN and the ground potential GND, current flows intermittently at the switching frequency f. The potential of the connection point X alternately switches between the power supply voltage VIN and the ground potential GND at the switching frequency f.

The connection point X is connected to the coil L0. The output side terminal of the coil L0 is connected to an output capacitor C0, of which the other terminal is connected to ground potential GND, and to the choke coil module 1. The coil L0 and the output capacitor C0 serve to smooth the voltage at the connection point X. Thus, at the source output terminal X1 which is the connection point of the coil L0 and the output capacitor C0, the voltage variation between the power supply voltage VIN and the ground potential GND that are alternately repeated at the connection point X is smoothed. Accordingly, a source output voltage including a voltage variation corresponding to a ripple voltage is output.

In a stage subsequent to the source output terminal X1, the choke coil module 1 is connected. The choke coil module 1 reduces the noise of the switching frequency f and its harmonic frequencies. The switching frequency f in the switching power supply 5 is determined in accordance with, e.g., the output electric power rating and the specification and rating of each constituent member. For example, a vehicle-mounted switching power supply may be operated at several hundred kHz. As a result, the switching frequency f and its harmonic frequencies may overlap the frequency band of the vehicle-mounted AM radio (around 500 to 1700 kHz). The choke coil module 1 is provided to reduce noise in such band.

The choke coil module 1 is structured such that the choke coil L1 is disposed in an output voltage path connecting the source output terminal X1 and the output terminal VO. A part of the choke coil L1 on the output terminal VO side is positioned outside the metal casing 3.

The switching operation of the switching power supply 5 at the switching frequency f in some cases has an influence as a source of noise at the locations of various circuits in the metal casing 3. The noise herein refers to harmonic noise caused by, e.g., the current variation at the power supply voltage VIN and the ground potential GND and the voltage variation between the power supply voltage VIN and the ground potential GND at the connection point X accompanying the on-off control of the power transistor T. For example, the harmonic noise accompanying the voltage variation at the connection point X may cause unexpected harmonic noise in a coupled circuit element, depending on the capacitive coupling of parasitic capacitive components present between the circuit elements or wires and the like in the metal casing 3. The current variation at the power supply voltage YIN and the ground potential GND may cause unexpected voltage variation of the power supply voltage VIN and the ground potential GND, depending on the counter-electromotive force due to parasitic inductive components between the wiring path of the power supply voltage VIN and the wiring path of the ground potential GND in the metal casing 3, and the voltage variation may case harmonic noise. Depending on the electromagnetic coupling such as capacitive coupling and inductive coupling, unexpected harmonic noise may be caused in the coupled circuit element.

The harmonic noise may propagate across the choke coil module 1 and reach the output terminal VO, and the noise may become superposed on the output voltage. As a result, the harmonic noise may adversely affect other electric equipment via the accessory battery or directly.

The choke coil module 1 of the first embodiment is configured to suppress the propagation of the noise to the output terminal VO. The choke coil L1 of the choke coil module 1 may be affected by noise due to electromagnetic coupling. However, of the choke coil L1, in a region outside the metal casing 3 and a region in an opening 3A of the metal casing 3 (see FIG. 5), the metal casing 3 provides the effect of an electromagnetic shield. Accordingly, the electromagnetic coupling that allows the propagation of noise generated by the switching operation of the switching power supply 5 is suppressed. On the other hand, of the choke coil L1, in the region housed inside the metal casing 3, noise accompanying the switching operation may propagate due to electromagnetic coupling. However, in this case, the propagating noise is reduced before reaching the output terminal VO via the remaining portion of the choke coil L1 that is present in a stage subsequent to the position of propagation. As a result, the noise propagating to the output terminal VO via the choke coil L1 of the choke coil module 1 is reduced.

In the choke coil module 1 of the first embodiment, the electromagnetic coupling between a part of the choke coil L1 on the output terminal VO side and the switching power supply 5 is suppressed by the metal casing 3, whereby the propagation of noise by electromagnetic coupling is reduced. The propagation of the noise generated as a result of the operation of the switching power supply 5 to the output terminal VO is reduced. In this way, the entry of noise in the output voltage can be reduced.

Figure 2:
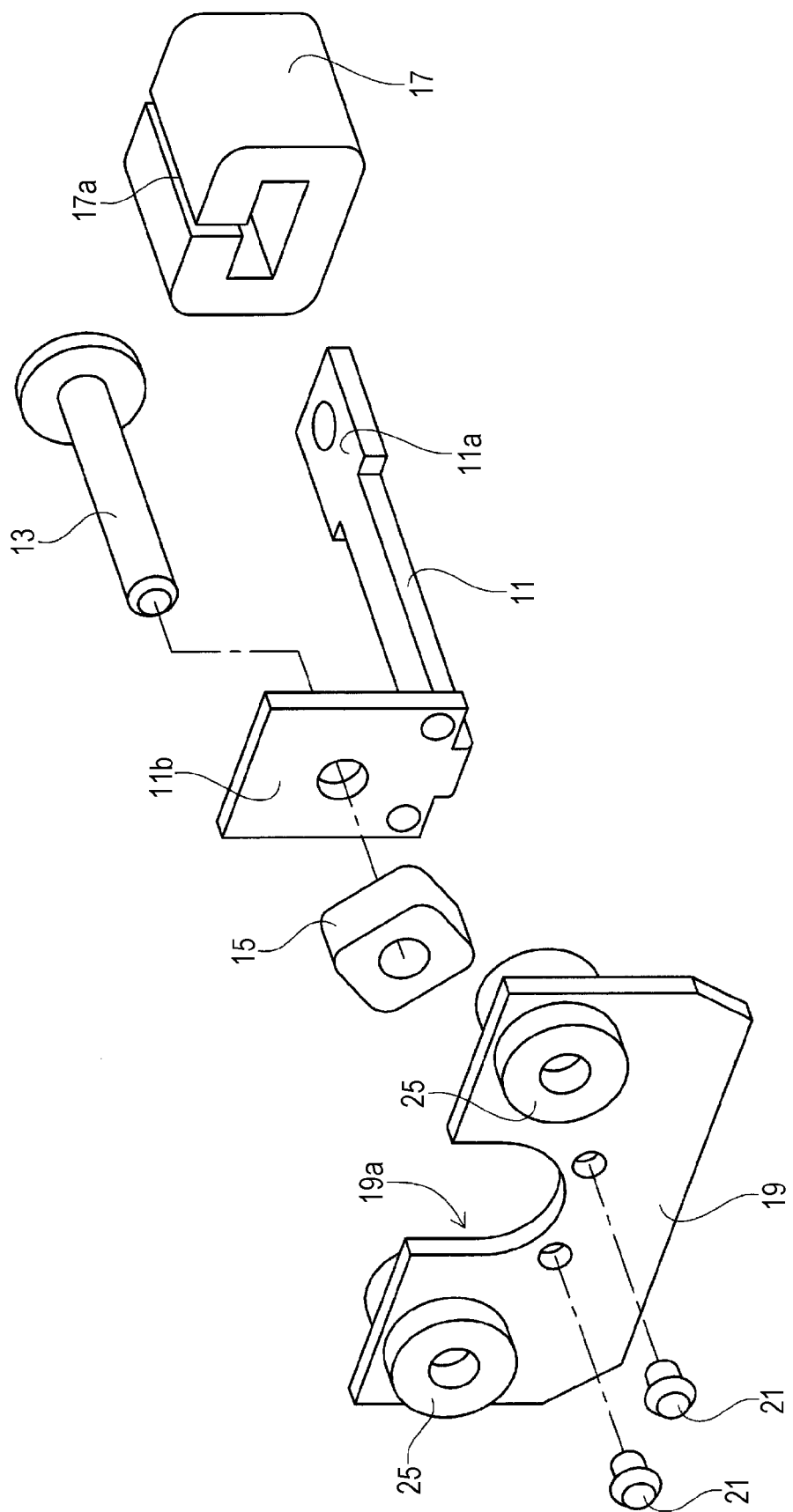
FIG. 2 is an exploded perspective view of the choke coil module of the first embodiment.
Figure 3:
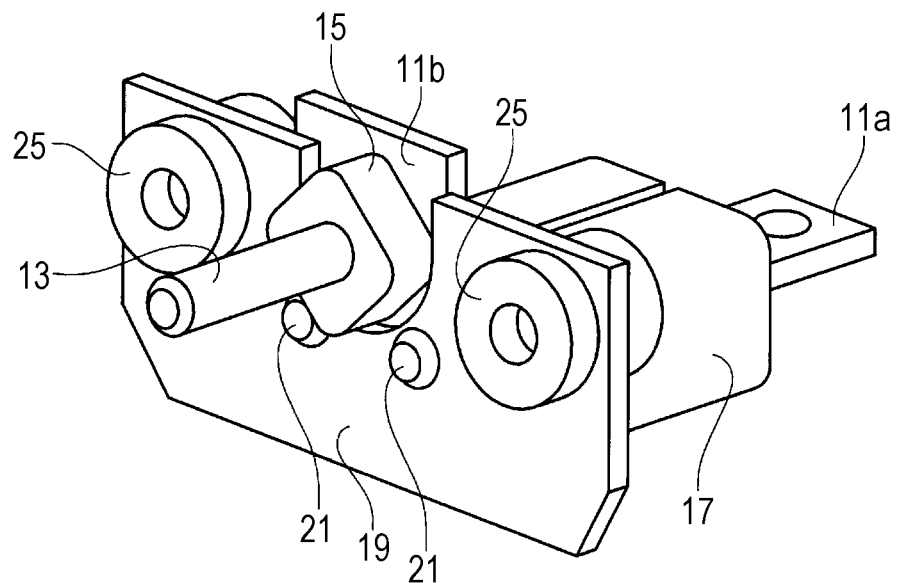
FIG. 3 is a perspective view of the choke coil module of the first embodiment in an assembled state.
Figure 4:
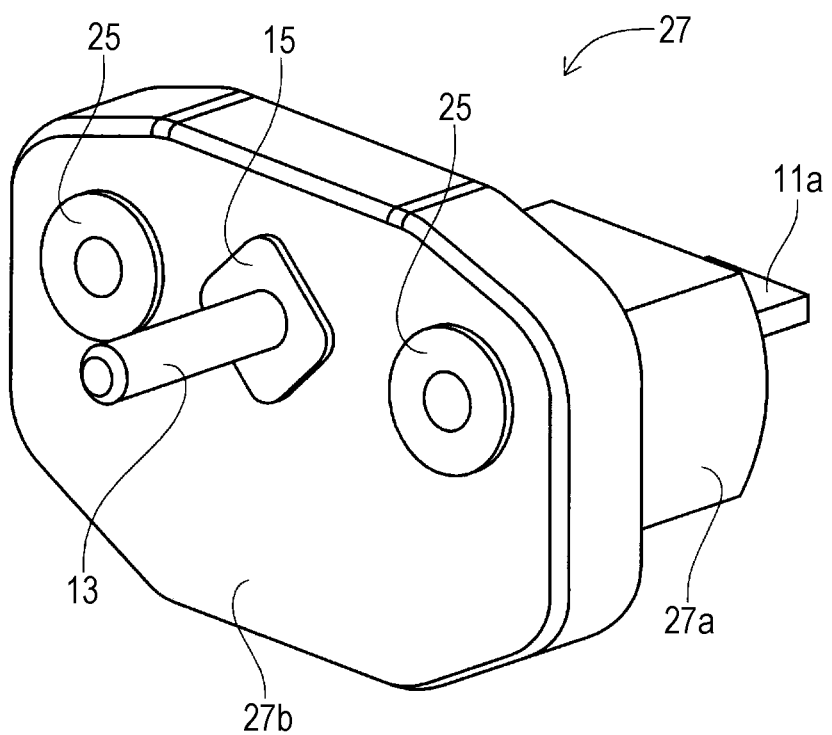
FIG. 4 is a perspective view of the choke coil module of the first embodiment after resin molding.

The shape and structure of a module configuration of the choke coil module 1 will be described. FIG. 2 is an exploded perspective view of the choke coil module 1. In FIG. 3, the members of the choke coil module 1 are in an assembled and yet-to-be resin molded state. FIG. 4 is a perspective view of the choke coil module 1 after resin molding.

The output voltage path illustrated in FIG. 1 connecting the source output terminal X1 and the output terminal VO includes a bus bar 11, an output pin 13, and a nut 15 linking the output pin 13 with the bus bar 11.

The bus bar 11 is made of copper and has a flat bar-like shape, with a tin-plated surface, for example. The bus bar 11 has L shape including a flange portion 11a at one end, a portion extending from the flange portion 11a toward the outside of the metal casing 3 when the bus bar 11 is fitted thereto, and a flange portion 11b at the other end which is bent upward at substantially right angle. The flange portions 11a and 11b both have a rectangular plate shape with increased width, with an open flange center. Via the opening in the flange portion 11a, the bus bar 11 and the source output terminal X1 disposed in the metal casing 3 are linked. For example, the bus bar 11 and the source output terminal X1 are linked by screwing, via the opening in the flange portion 11a, a bolt into a clinching nut (not shown) disposed on a bottom surface portion of the metal casing 3. Other linking methods, such as engagement by crimping or welding, may be used. In the flange portion 11b, the output pin 13 and the nut 15 are linked across the flange portion 11b via the opening therein, forming the output terminal VO. The output pin 13 and the nut 15 may be linked by various engagement methods, such as screwing and crimping, or by welding. The flange portion 11b further includes smaller-diameter openings formed at both ends on the root side of the flange portion 11b. The openings are provided for linking with a board 19 which will be described later.

Four corners of outer surfaces of a columnar ferrite core 17 inserted onto the bus bar 11 are chamfered. The ferrite core 17 has a rectangular cross section with a wide rectangular opening including the column axis provided in the central portion of the core. The opening has a width corresponding to at least the width of the flange portion 11a so that the ferrite core can be inserted onto the bus bar 11 via the flange portion 11a. The ferrite core 17 also has a slit 17a parallel with the column axis for adjusting the magnetic resistance of the ferrite core 17 so as to prevent magnetic saturation. By inserting the ferrite core 17 onto the bus bar 11, the choke coil L1 is formed.

The board 19 is provided to form a flange portion 27b (see FIG. 4) of the choke coil module 1. The board 19 has a wide rectangular shape with a semi-circular cutout portion 19a provided at the center on one of the longer sides so as to clear the output pin 13 and the nut 15 when the choke coil module 1 is assembled. The corners of the other longer side are diagonally chamfered. On both sides of the cutout portion 19a, cylindrical metal members 25 with central openings are affixed through the board 19. In the vicinity of the cutout portion 19a, openings for linking the bus bar 11 are provided. These openings are disposed at positions corresponding to the smaller-diameter openings in the flange portion 11b of the bus bar 11. The openings are provided for linking the bus bar 11 and the board 19 by, e.g., inserting and screwing bolts or screws and the like 21 through the openings. Other than by screwing, general affixing methods such as crimping and welding may be used.

The metal members 25 are affixed to the metal casing 3 via bolts and the like which are not shown. Other general affixing methods, such as screwing, crimping, or welding, may be used.

FIG. 4 illustrates a module 27 obtained by housing the assembled choke coil module 1 (FIG. 3) in a molded member of thermosetting resin. The thermosetting resin is used so as not to apply excessive pressure to the ferrite core 17. For example, phenol resin or epoxy resin is used.

The module 27 includes a core portion 27a and a flange portion 27b which are resin molded members. The core portion 27a houses the ferrite core 17 and the bus bar 11 with the ferrite core inserted thereto. The core portion has a cylindrical shape with an axis in the wiring direction of the bus bar 11. The flange portion 27b houses the board 19, the metal members 25, and the connected portions of the board 19 and the bus bar 11. The flange portion 27b has rectangular plate-like surfaces perpendicular to the cylinder axis of the core portion 27a. On the surfaces, both axial end faces of the metal members 25 are exposed.

Figure 5:
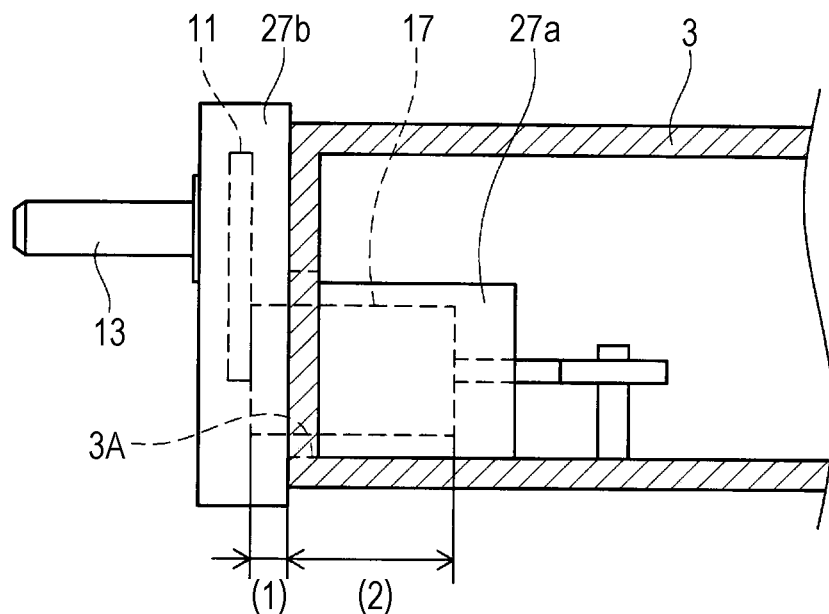
FIG. 5 illustrates a state in which the choke coil module of the first embodiment is mounted to the switching power supply.

As illustrated in FIG. 5, the choke coil module 1 is mounted such that the end face of the flange portion 27b on the core portion 27a side (the inner end face) is opposite the outer end face of the metal casing 3. The module 27 is attached to the metal casing 3 by screwing screws or bolts and the like (not shown) into the metal casing 3 via the openings in the metal members 25. Thereby, the module is attached with the end faces of the flange portion 27b and the metal casing 3 closely contacted with each other. Accordingly, the choke coil module 1 can be reliably affixed and attached to the metal casing 3. Besides by screwing, other general affixing methods, such as crimping and welding, may be used.

A portion of the ferrite core 17 from the end thereof on the flange portion 11a side of the bus bar 11 to an intermediate region thereof is housed in the molded core portion 27a (a region (2) in FIG. 5). The remaining region is housed in the molded flange portion 27b (a region (1) in FIG. 5). The module 27 is affixed to the metal casing 3 in such a way that the inner end face of the flange portion 27b is closely contacted with the outer end face of the metal casing 3. Accordingly, of the ferrite core 17 housed in the module 27, in the portion in the region (1) and in the portion of the region (2) that is in the opening 3A of the metal casing 3, electromagnetic coupling from the inside of the metal casing 3 is suppressed by the interposed metal casing 3. Accordingly, the noise accompanying the operation of the internal switching power supply 5 is prevented from being transmitted to the output pin 13 (the output terminal VO) via the ferrite core 17.

Of the region (2) of the ferrite core 17, the portion on the inside beyond the opening 3A of the metal casing 3 may be subject to the influence of electromagnetic coupling, whereby the noise accompanying the operation of the switching power supply 5 may be transmitted to the ferrite core 17 and the bus bar 11. However, the inductance components due to the region (2) of the ferrite core 17 that is located in a stage subsequent to the noise propagation position and further due to the region (1) of the ferrite core 17 function as choke coils, whereby the noise is reduced.

Figure 6:
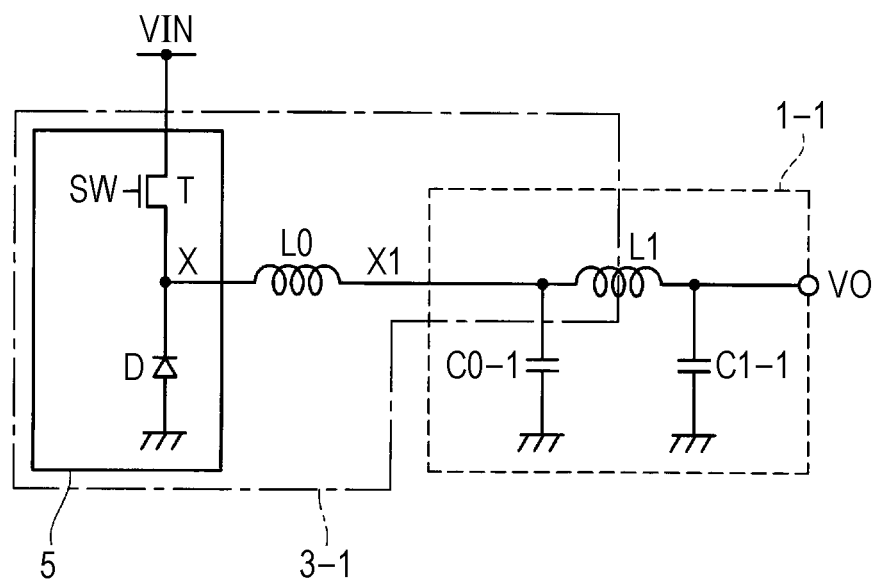
FIG. 6 is a circuit diagram of a π-type filter module, as an example of the noise reducing device according to the second embodiment, connected to the switching power supply.

FIG. 6 is a circuit diagram of a second embodiment of the present application. A case will be described in which a π-type filter module 1-1 is provided as an example of the noise reducing device, instead of the choke coil module 1 according to the first embodiment. The π-type filter module 1-1 has, in addition to the configuration of the choke coil module 1 of the first embodiment, a configuration including capacitors C0-1 and C1-1 in the module. The elements same as or similar to those of the first embodiment will be designated with signs same as or similar to those of the first embodiment, and their description will be omitted.

In the second embodiment, the capacitor C0-1 is provided in place of the output capacitor C0. The capacitor C0-1 constitutes the π-type filter module 1-1 together with the choke coil L1 and capacitor C1-1. The capacitor C0-1 may double as an output capacitor for the switching power supply 5. In an on-period of the power transistor T, the electromagnetic energy accumulated in the coil L0 is released to the output side including the capacitor C0-1. The capacitor C0-1 functions as an output capacitor in an off-period of the power transistor T.

The π-type filter module 1-1 is connected in a stage subsequent to the source output terminal X1, replacing the choke coil module 1. In the configuration of the π-type filter module 1-1, in addition to the choke coil L1, the capacitors C0-1 and C1-1 are provided between each terminal of the choke coil L1 and the ground potential GND. The choke coil L1 is disposed in an output voltage path connecting the source output terminal X1 and the output terminal VO. A part of the choke coil L1 on the output terminal VO side is positioned outside the metal casing 3-1 and in the opening of the metal casing 3-1. In addition, the capacitors C0-1 and C1-1 are disposed outside the metal casing 3-1.

According to the second embodiment, the π-type filter module 1-1 reduces the propagation of the harmonic noise produced as a result of the voltage variation arising from the switching operation of the switching power supply 5 to the output terminal VO, as in the case of the choke coil module 1 of the first embodiment.

Specifically, a part of the choke coil L1 constituting the π-type filter module 1-1 is disposed outside the metal casing 3-1 and in the opening of the metal casing 3-1. The metal casing 3-1 provides an electromagnetic shield effect that suppresses electromagnetic coupling. As a result, the noise due to electromagnetic coupling is suppressed from propagating to that portion. On the other hand, in the region of the choke coil L1 that is housed inside the metal casing 3-1, the noise may propagate due to electromagnetic coupling. However, in this case, the propagating noise is reduced by the filtering operation of the π-type filter 1-1 before reaching the output terminal VO.

Thus, the electromagnetic coupling via the choke coil L1 of the π-type filter module 1-1 is suppressed, whereby the propagation of the noise due to the electromagnetic coupling is reduced.

The propagation of the electromagnetic coupling-caused noise to the capacitors C0-1 and C1-1 constituting the π-type filter module 1-1 is also suppressed. This is because the capacitors C0-1 and C1-1 are located outside the metal casing 3-1 so that the electromagnetic coupling is suppressed by the electromagnetic shield effect of the metal casing 3-1. The diversion of voltage variation via the ground potential GND is also suppressed. This is because the ground potential GND supplied to the capacitors C0-1 and C1-1 is supplied from the metal casing 3-1 via the metal members 25, and because the metal casing 3-1 has a wide plate-like shape that leads to sufficiently low impedance. The low impedance suppresses the entry of voltage variation into the supplied ground potential GND. Accordingly, a stable ground potential GND in which noise is suppressed can be maintained.

Thus, the electromagnetic coupling via the capacitor C0-1 and the electromagnetic coupling via the C1-1 of the π-type filter module 1-1 are suppressed. Further, the diversion of voltage variation via the ground potential GND is suppressed. Accordingly, the propagation of noise to the output terminal VO by electromagnetic coupling or due to the diversion of voltage variation through the ground potential is suppressed.

The propagation of noise via the choke coil L1 and the capacitor C0-1 or C1-1 constituting the π-type filter module 1-1 is suppressed. Accordingly, the noise generated by the operation of the switching power supply 5 is suppressed from propagating to the output terminal VO. Accordingly, the entry of noise into the output voltage can be suppressed.

Figure 7:
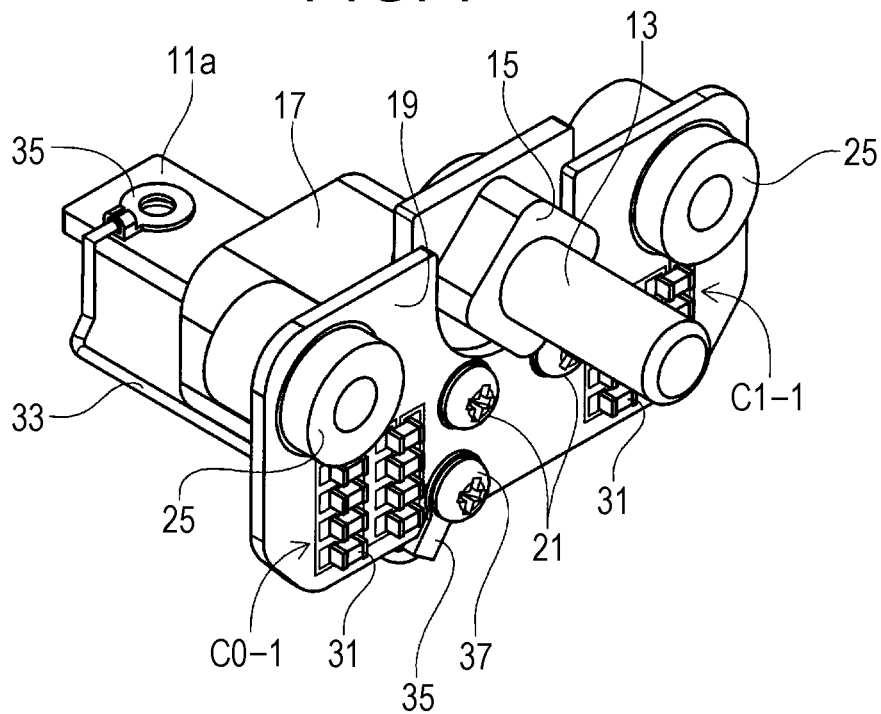
FIG. 7 is a perspective view of the π-type filter module of the second embodiment in an assembled state.
Figure 8:
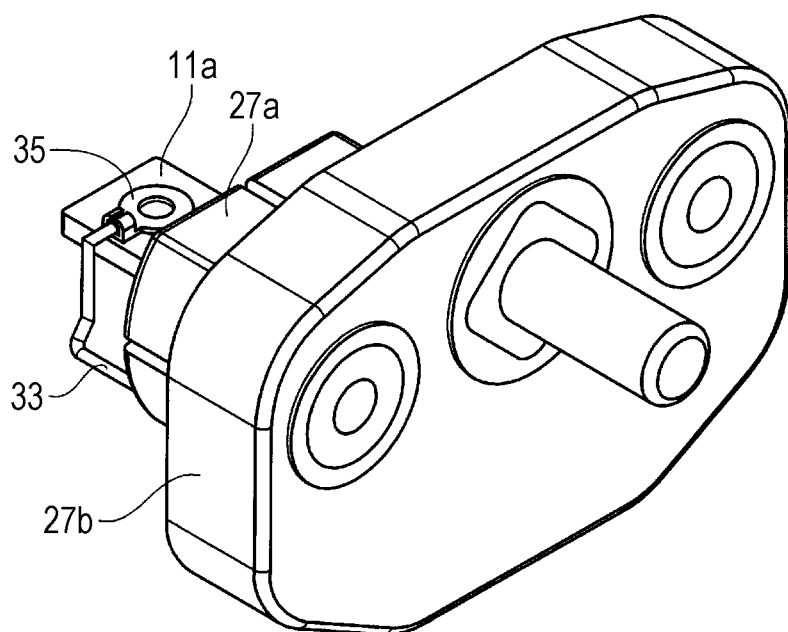
FIG. 8 is a perspective view of the π-type filter module of the second embodiment after resin molding.

The shape and structure of a module configuration of the π-type filter module 1-1 will be described. In FIG. 7, the various members of the π-type filter module 1-1 are in an assembled and yet-to-be resin molded state. FIG. 8 is a perspective view of the π-type filter module 1-1 after resin molding. The elements same as or similar to those of the first embodiment will be designated with signs same as or similar to those of the first embodiment, and their description will be omitted.

In regions adjacent to the metal members 25 of the board 19, chip capacitors 31 are mounted. In the chip capacitors 31, their terminals are electrically connected via a wiring pattern, not shown, engraved on the board 19. In one group of the chip capacitors 31 disposed on one side (the right side in FIG. 7), some of the chip capacitors 31 are partially connected in series. The series-connected chip capacitors 31 are further connected in parallel. One terminal of the parallel-connected chip capacitors 31 is connected to the output pin 13 via bolts or screws and the like 21. The other terminal of the parallel connection is connected to the metal member 25 disposed on one side (the right side in FIG. 7). The output pin 13 corresponds to the output terminal VO. The metal member 25 is supplied with the ground potential GND. The group of the capacitors 31 disposed on the one side (the right side in FIG. 7) constitutes the capacitor C1-1. Similarly, of the group of the chip capacitors 31 disposed on the other side (the left side in FIG. 7), some of the chip capacitors 31 are partially connected in series. The series-connected chip capacitors 31 are further connected in parallel. One terminal of the parallel-connected chip capacitors 31 is connected to the flange portion 11*a* of the bus bar 11 (as will be described later). The other terminal of the parallel connection is connected to the metal member 25 disposed on the other side (the left side in FIG. 7). The flange portion 11*a* is connected to the source output terminal X1. The metal member 25 is supplied with the ground potential GND. The group of the capacitors 31 disposed on the other side (the left side in FIG. 7) constitutes the capacitor C0-1.

When the module is attached to the metal casing 3-1 so as to supply the ground potential GND to the metal members 25, the metal members 25 are preferably press-fitted to the metal casing 3. For the attaching, general affixing methods such as crimping and welding may be used in addition to screwing.

In the group of chip capacitors 31 disposed on the other side (the left side in FIG. 7), in order to connect the one terminal of the parallel-connected chip capacitors to the flange portion 11*a* of the bus bar 11, a lead wire 33 with crimping terminals 35 crimped on both ends thereof is provided. One crimping terminal 35 is connected to one terminal engraved on the board 19. The other crimping terminal 35 is linked with the source output terminal X1 as well as the flange portion 11*a*. For the connection and linking of the crimping terminals 35, any method for achieving electrical connection may be used, such as crimping engagement or welding, in addition to the screwing with screws 37 and the like.

As the lead wire 33, there may be applied any lead wire having sufficiently low impedance and that does not cause unwanted voltage variation in accordance with the operation current flow. In this case, it goes without saying that the lead wire 33 may be configured to avoid contact or short-circuit with other portions by partially affixing and protecting the wire with molded resin or using a covered wire in an exposed portion thereof.

The board 19 is housed in the molded flange portion 27*b*. Accordingly, the chip capacitors 31 constituting the capacitors C0-1 and C1-1 are also housed in the molded flange portion 27*b*. When the π-type filter module 1-1 is mounted, the flange portion 27*b* is affixed with the inner end face thereof closely contacted with the outer end face of the metal casing 3-1. In this way, as in the case of the portions of the ferrite core 17 that are outside the metal casing 3-1 and in the opening of the metal casing 3-1, electromagnetic coupling to the capacitors C0-1 and C1-1 from inside the metal casing 3-1 is suppressed by the interposed metal casing 3-1. As a result, as the electromagnetic coupling via the ferrite core 17 is suppressed, the transmission of noise to the output pin 13 (the output terminal VO) due to the electromagnetic coupling via the capacitor C0-1 or C1-1 is suppressed.

Of the choke coil L1, the portion on the inside beyond the opening of the metal casing 3-1 may be subject to the influence of electromagnetic coupling. However, the noise propagating by the electromagnetic coupling is reduced by the filtering operation of the π-type filter 1-1 before reaching the output terminal VO.

The ground potential GND connected to the chip capacitors 31 contained in the flange portion 27*b* is supplied from the metal casing 3-1 with sufficiently low impedance. Accordingly, the voltage variation due to the operation of the switching power supply 5 can be suppressed from diverging to the ground potential GND being supplied to the chip capacitors 31. The voltage variation by the diversion via the ground potential GND to the capacitors C0-1 and C1-1 is suppressed. Thus, the unexpected transmission of noise to the output pin 13 (the output terminal VO) due to the diversion is suppressed.

The switching power supply 5 is an example of electronic equipment. The output voltage is an example of an output signal. The output voltage path and the bus bar 11 are examples of an output line. The flange portion 11*a* of the bus bar 11 is an example of a connection terminal. The source output terminal X1 is an example of an output end associated with the electronic equipment. The flange portion 11*b* of the bus bar 11, the output pin 13, and the nut 15 are examples of an output terminal. The ferrite core 17 is an example of a magnetic material core. The capacitor C0-1 is an example of a first capacity element. The capacitor C1-1 is an example of a second capacity element. The metal members 25 are an example of a metal base portion.

As described above in detail, in the choke coil module 1 of the first embodiment disclosed in the present application, a part of the ferrite core 17 on the output terminal VO side is disposed outside the metal casing 3 and in the opening 3A of the metal casing 3. Accordingly, the capacitive coupling of the part of the choke coil L1 on the output terminal VO side constituting the choke coil module 1 and the switching power supply 5 is suppressed by the metal casing 3. Entry of noise generated by the operation of the switching power supply 5 into the choke coil L1 outside the metal casing 3 and in the opening 3A of the metal casing 3 is suppressed, whereby the propagation of noise to the output terminal VO is suppressed.

In the region of the choke coil L1 that is in the metal casing 3, the noise accompanying the operation of the switching power supply 5 may propagate by electromagnetic coupling. However, the propagating noise is reduced by the choke coil module 1 before reaching the output terminal VO via the subsequent stage portion of the choke coil L1. The noise that enters the choke coil L1 in the metal casing 3 is reduced by the choke coil module 1, so that the propagation of the noise to the output terminal VO is suppressed. Conversely, when a part of the choke coil L1 is housed in the metal casing 3, the external noise is prevented from reaching the choke coil L1 by electromagnetic coupling. Accordingly, the external noise is not transmitted to the interior of the metal casing 3. The entry of the external noise into the casing is prevented also by the electromagnetic coupling shielding effect of the metal casing 3. In this way, the circuit mounted in the metal casing 3 is not subject to the influence of disturbance, ensuring stable operation of the circuit.

When the individual components are individually arranged and connected in the metal casing 3, the extent of electromagnetic coupling may vary depending on the mutual positional relationship of the components and the routing of their wiring. Accordingly, in order to reduce electromagnetic coupling, it is necessary to analyze various arrangements and wire routing and the like before determining a positional arrangement and wiring. In this respect, by fitting the choke coil module 1 to the metal casing 3 as the module 27, electromagnetic coupling and therefore noise can be reduced without taking various arrangements and wire routing and the like into consideration. Thus, it is not necessary to optimize the individual circuit arrangements and wire routing and the like in the metal casing 3 housing electronic equipment such as the switching power supply 5, in accordance with the state of entry of noise and in view of the specification and rating of each electronic equipment in the metal casing 3 and the casing. By using a general-purpose arrangement of circuit arrangements and wire routing in accordance with the noise bandwidth to be reduced, an intended effect can be achieved. The entry of noise into the output signal can be reduced in a simple, easy, and general-purpose manner.

The thickness of the flange portion 27b of the module 27 that is molded is determined by the thickness of the module 27 as assembled from the board 19, the flange portion 11b of the bus bar 11, the output pin 13, the nut 15 and the like, or by the thickness of the metal members 25. These thicknesses can be made small compared with the size of the metal casing 3 housing the electronic equipment such as the switching power supply 5. In the choke coil module 1 of the first embodiment, the flange portion 27b protrudes outside the metal casing 3 rather than being contained therein. However, the thickness of the flange portion 27b is small. Accordingly, compared with when the choke coil module 1 is contained in the metal casing 3, an increase in package volume can be minimized.

The choke coil module 1 includes the module 27, ensuring reliability with respect to the surrounding environment including vibrations, dust, temperature and the like.

The π-type filter module 1-1 according to the second embodiment disclosed in the present application provides an operation and effect same as or similar to the operation and effect provided by the choke coil module 1 of the first embodiment. In addition, the electromagnetic coupling between the capacitors C0-1 and C1-1 constituting the π-type filter module 1-1 and the switching power supply 5 is suppressed. This is due to the fact that, when the π-type filter module 1-1 is attached such that the flange portion 27b is installed on the outside of the metal casing 3-1, the capacitors C0-1 and C1-1 housed in the flange portion 27b are disposed outside the metal casing 3-1, whereby the π-type filter module 1-1 is electromagnetically shielded.

The ground potential GND of the capacitors C0-1 and C1-1 housed in the flange portion 27b is supplied from the metal casing 3-1 via the metal members 25. Accordingly, the voltage variation accompanying the operation of the switching power supply 5 that may become mixed in the ground potential GND is suppressed. This is because the metal casing 3-1 has sufficiently low impedance that the voltage variation accompanying the transient flow of operation current caused by the operation of the switching power supply 5 is suppressed from propagating to the metal casing 3-1. In this way, the diversion of voltage variation to the capacitors C0-1 and C1-1 via the ground potential GND is suppressed.

As a result of the suppression of electromagnetic coupling to the capacitors C0-1 and C1-1, and the suppression of the diversion of voltage variation via the ground potential GND, the propagation of the voltage variation to the output terminal VO via the capacitors C0-1 and C1-1 is suppressed.

In the π-type filter module 1-1 housed in the molded member according to the second embodiment, in addition to the components mounted in the module 27 of the first embodiment, there are newly provided the chip capacitors 31, the lead wire 33, the crimping terminals 35 attached to the ends of the lead wire 33, and the screw 37 fastening the crimping terminals 35. An increase in thickness due to the mounting of the additional components is so small that the additional components can be housed within the thickness of the flange portion 27b of the module 27. Thus, the thickness of the flange portion 27b in the π-type filter module 1-1 may be equivalent to that of the flange portion 27b according to the first embodiment. While the flange portion 27b protrudes outside the metal casing 3-1 as in the case of the first embodiment, the thickness of the flange portion 27b is small. Accordingly, compared with when the π-type filter module 1-1 is contained in the metal casing 3-1, an increase in packing volume can be minimized.

The technology disclosed in the present application is not limited to the embodiments. It goes without saying that various improvements and modifications may be made without departing from the gist.

In the embodiments, a part of the ferrite core 17 on the output terminal VO side is positioned outside the metal casing 3 or 3-1 so as to be housed in the flange portion 27b. In this way, the electromagnetic coupling with the interior of the metal casing 3 or 3-1 including the switching power supply 5 and the like is suppressed using the metal casing 3 or 3-1, reducing the entry of noise. However, the present application is not limited to such embodiments. Instead of the ferrite core 17 being housed in the core portion 27a with the tip portion of the ferrite core on the output terminal VO side being disposed outside the metal casing 3 or 3-1, the ferrite core may be positioned in the opening of the metal casing 3 and yet the electromagnetic coupling can be suppressed using the metal casing 3 or 3-1, whereby the entry of noise can be reduced.

The module 27 as a whole, or the core portion 27a including the part of the ferrite core 17 on the output terminal VO side and the flange portion 27b may be enclosed by a metal member for electromagnetic shielding, whereby electromagnetic coupling can be suppressed. In this case, the portion to be electromagnetically shielded may be the region between the output terminal VO and at least the part of the ferrite core 17 on the output terminal VO side. In this way, electromagnetic coupling can be suppressed, whereby the entry of noise into the output voltage can be suppressed.

The first embodiment has been described with reference to the case where the module 27 is provided with the flange portion 27b for reliable affixing to the metal casing 3. However, the present application is not limited to the embodiment. The module 27 may have a substantially cylindrical shape not provided with the flange portion 27b and only provided with the core portion 27a.

The embodiments have also been described with reference to the ferrite core 17 provided with the slit 17a parallel with the column axis. However, the present application is not limited to the embodiments. The slit 17a is provided to adjust the magnetic resistance of the ferrite core 17 so as to prevent magnetic saturation. Accordingly, it goes without saying that in another configuration, depending on the physical size of the ferrite core 17 and the current flow rating and the like, magnetic saturation may not be caused even without the slit.

The embodiments have also been described with reference to the case where thermosetting resin is used as the resin for the molded member for housing the choke coil module 1 or the π-type filter module 1-1. However, it goes without saying that thermoplastic resin such as PBT (polybutylene terephthalate), PPS, and polycarbonate resin may also be used.

The second embodiment has been described with reference to the case where the capacitors C0-1 and C1-1 are both mounted on the board 19 as the chip capacitors 31 so as to be disposed outside the metal casing 3-1. However, the present application is not limited to such embodiment. In another configuration, depending on the configuration of the board, the module and the like, some of the chip capacitors 31 or the chip capacitors 31 corresponding to either the capacitor C0-1 or C1-1 may be disposed outside the metal casing 3-1 or in the opening of the metal casing 3-1 while the other chip capacitors may be disposed in the metal casing 3-1. As long as the electromagnetic coupling can be suppressed with respect to some of the capacitors C0-1 and C1-1, the propagation of noise to the output terminal VO via the capacitor C0-1 or C1-1 can be suppressed.

With reference to the second embodiment, it has also been described that the capacitors C0-1 and C1-1 are both mounted on the board 19 as the chip capacitors 31, and that the ground potential GND is supplied from the metal casing 3-1 via the metal members 25. However, the present application is not limited to the embodiment. In another configuration, depending on the configuration of the board, the module and the like, the supplied ground potential GND may be supplied via the metal casing 3-1 with respect to only some of the chip capacitors 31 or the chip capacitors 31 corresponding to either the capacitor C0-1 or C1-1. As long as the diversion of the power supply variation from the ground potential GND can be suppressed with respect to some of the capacitors C0-1 and C1-1, the propagation of noise to the output terminal VO via the capacitor C0-1 or C1-1 can be suppressed.

In the first embodiment and the second embodiment, the choke coil module 1 and the π-type filter module 1-1 respectively have been described as examples of the noise reducing device. However, the present application is not limited to such embodiments. For example, the capacitor C0-1 may be eliminated from the π-type filter module 1-1 described with reference to FIGS. 6 to 8, so that the LC filter module is composed of the choke coil L1 and the capacitor C1-1. Obviously, such LC filter module can also provide the operation and effect similar to those of the first and second embodiments, whereby the electromagnetic coupling and the diversion of voltage variation via the ground potential GND can be suppressed with respect to the choke coil L1 and the capacitor C1-1.

Further, by adopting a module configuration for the coil L0 and the output capacitor C0 in the first embodiment (see FIG. 1), the coil L0 in the second embodiment (FIG. 6), and the coil L0 and the output capacitor C0-1 when an LC filter module is configured, a similar operation and effect to those of the first or second embodiment, i.e., the suppression of electromagnetic coupling and the suppression of the diversion of power supply variation, can be obtained for these elements.

The second embodiment has been described with reference to the mode of implementation where the supply of the ground potential GND to the capacitors C0-1 and C1-1 is conducted via the metal casing 3-1. However, the present application is not limited to such implementation. The output noise reducing device only needs to be configured such that the propagation of the voltage variation caused by the operation of the switching power supply 5 to the ground potential GND being supplied to the capacitors C0-1 and C1-1 can be suppressed. For example, in a grounding wire path through which the flow of operation current due to the operation of the switching power supply 5 passes, a voltage drop may be caused depending on the flow of operation current even when the impedance of the path is low. As a result, voltage variation may be caused in the grounding wire path. Further, if the grounding wire path has a parasitic inductance component, a counter-electromotive force may be produced by electromagnetic induction in accordance with the turning on and off of the operation current. As a result, a potential difference may be caused in the grounding wire path, or a voltage variation may be caused in the grounding wire path. In order to prevent the voltage variation in the grounding wire path from propagating to the ground potential GND supplied to the capacitors C0-1 and C1-1, the ground potential GND may be supplied via a path having a sufficiently low impedance, such as the metal casing 3-1 described with reference to the second embodiment. In another example, a grounding wire path for supplying the ground potential to the switching power supply 5 and a grounding wire path for supplying the ground potential GND to the capacitors C0-1 and C1-1 may branch from a source grounding terminal for supplying the ground potential. In this way, the operation current that flows to the ground potential in accordance with the operation of the switching power supply 5 flows through the grounding wire path branched from the grounding wire that supplies the ground potential GND to the path capacitors C0-1 and C1-1. Accordingly, the influence of the operation current on the ground potential GND supplied to the capacitors C0-1 and C1-1 can be eliminated. As a result, the diversion of the voltage variation of the ground potential due to the operation of the switching power supply 5 can be prevented.

There may be further provided a first capacity element and a second capacity element. A first terminal of the first capacity element is connected to the output line between the magnetic material core and the connection terminal. To a second terminal of the first capacity element, the ground potential is supplied. A first terminal of the second capacity element is connected to the output line between the magnetic material core and the output terminal. To a second terminal of the second capacity element, the ground potential is supplied. The ground potential may be supplied via the metal casing.

In this way, in addition to the inductance element including the magnetic material core with the output line penetrating therethrough and connected in series in the output signal path, the first and second capacity elements are connected at the ends of the inductance element. In this way, a so-called π-type filter is formed. The ground potential supplied to the first and second capacity elements constituting the π-type filter is supplied via the metal casing. The metal casing has a wide shape with sufficiently reduced impedance. Accordingly, the metal casing can have a stable ground potential with the entry of noise being suppressed. Thus, a stable ground potential with little noise can be obtained as the ground potential for the first and second capacity element.

The connection terminal of the output line is connected to the output end of the electronic equipment in the metal casing. The output terminal of the output line is disposed outside the metal casing via an opening of the metal casing through which the output line is disposed. In this state, at least the output terminal side part of the magnetic material core may be positioned outside the metal casing. Alternatively, the output terminal side part may be positioned in the opening of the metal casing. In this way, in the inductance element including the output line and the magnetic material core, electromagnetic coupling from the electronic equipment is suppressed by the metal casing on the outside of the metal casing or in the opening of the metal casing. On the inside of the metal casing, electromagnetic noise may become superposed by electromagnetic coupling. However, the noise is reduced by the inductance element disposed in a stage subsequent to the position where the electromagnetic noise becomes superposed. Accordingly, by selecting the attached position of the magnetic material core with respect to the metal casing, the influence of the electromagnetic coupling from the electronic equipment can be reduced without the addition of new members or components, resulting in a reduce in noise.

In this case, the first capacity element or the second capacity element, or the first and second capacity elements may have at least a part of body portions with a capacitive component positioned outside the metal casing or in the opening of the metal casing. In this way, the electromagnetic coupling from the electronic equipment is suppressed by the metal casing at the portion of the first and/or second capacity element that is positioned outside the metal casing or in the opening of the metal casing, in addition to at the inductance element. Accordingly, the superposition of noise is reduced. Thus, by selecting the attached position of the first and second capacity elements with respect to the metal casing, the influence of the electromagnetic coupling from the electronic equipment is reduced without adding new members or components. Accordingly, a reduce in noise can be achieved.

The portion from the output terminal to at least the output terminal side part of the magnetic material core may be enclosed by a metal wall. In this way, the portion from the output terminal to at least a part of the magnetic material core via the output line is enclosed by the metal wall. Accordingly, the output line to the output terminal and at least the output terminal side part of the inductance element including the output line and the magnetic material core can be disposed in a region in which electromagnetic coupling is suppressed. By providing the metal wall having an electromagnetic shield effect, electromagnetic coupling suppression can be achieved. Accordingly, the output line and the like can be disposed even in the interior of the metal casing that may be subject to noise from the electronic equipment.

In this case, the first capacity element or the second capacity element, or the first and second capacity elements may have at least a part of body portions with a capacitive component enclosed by the metal wall. In this way, in addition to the inductance element, a part of the body portions of the first and/or second capacity element that includes the capacitive component can be disposed in the region enclosed by the metal wall and therefore having reduced electromagnetic coupling. Thus, by providing the metal wall having the electromagnetic shield effect, electromagnetic coupling suppression can be achieved. Accordingly, a part of the body portions of the capacity elements can be disposed even in the interior of the metal casing that may be subject to the noise from the electronic equipment.

The output line and the magnetic material core, or in addition thereto, the first and/or second capacity element, may be housed in an enclosure with the connection terminal and the output terminal at the ends of the output line being exposed. In this way, the noise reducing device can be provided as an integral component. By providing as the integral component, a general-purpose device for reducing the entry of noise into the output signal can be implemented regardless of whether for the metal casing or the electronic equipment housed therein.

In this case, a metal base portion that is crimped onto the metal casing when the enclosure is affixed to the metal casing may be provided. The metal base portion may be connected to the second terminal of the first and second capacity elements. In this way, the second terminal of the first and second capacity elements can be connected to the metal casing having the ground potential.

LIST OF NUMERAL REFERENCES

1 Choke coil module
1-1 π-type filter module
3, 3-1 Metal casing
3A Opening
5 Switching power supply
11 Bus bar
11a, 11b Flange portion
13 Output pin
15 Nut
17 Ferrite core
17a Slit
19 Board
19a Cutout portion
21 Bolt, screw and the like
25 Metal member
27 Module
27a Core portion
27b Flange portion
31 Chip capacitor
33 Lead wire
35 Crimping terminal
37 Screw
C0 Output capacitor
C0-1, C1-1 Capacitor
L0 Coil
L1 Choke coil
VO Output terminal
X Connection point
X1 Source output terminal

The invention claimed is:

1. An output noise reducing device that reduces noise that becomes mixed in an output signal from electronic equipment housed in a metal casing comprising:
   an output line; and
   a magnetic material core, wherein:
   one end of the output line is a connection terminal connected to an output end associated with the electronic equipment, and the other end is an output terminal;
   the magnetic material core has a through-hole through which the output line is disposed; and
   electromagnetic coupling from the electronic equipment is separated between the output terminal and at least a part of the magnetic material core on a side close to the output terminal along the output line;
   the connection terminal of the output line is connected to the output end of the electronic equipment in the metal casing;
   the output terminal of the output line is disposed outside the metal casing via an opening of the metal casing through which the output line is disposed; and
   at least a part of the magnetic material core on the side close to the output terminal is positioned outside the metal casing or in the opening of the metal casing.

2. The output noise reducing device according to claim 1, further comprising a first capacity element and a second capacity element, wherein:
   a first terminal of the first capacity element is connected to the output line between the magnetic material core and the connection terminal, with a ground potential being supplied to a second terminal of the first capacity element;
   a first terminal of the second capacity element is connected to the output line between the magnetic material core and the output terminal, with the ground potential being supplied to a second terminal of the second capacity element; and
   the ground potential is supplied via the metal casing.

3. The output noise reducing device according to claim 2, further comprising an enclosure in which the first and/or second capacity element, the output line, and the magnetic material core are housed with the connection terminal and the output terminal at the ends of the output line being exposed.

4. The output noise reducing device according to claim 3, further comprising a metal base portion, wherein when the enclosure is affixed to the metal casing, the metal base portion is crimped onto the metal casing while being connected to the second terminals of the first and second capacity elements.

5. The output noise reducing device according to claim 2, further comprising an enclosure in which the output line and the magnetic material core are housed with the connection terminal and the output terminal at the ends of the output line being exposed.

6. The output noise reducing device according to claim 1, wherein the first capacity element or the second capacity element, or the first and second capacity elements have at least a part of body portions with a capacitive component positioned outside the metal casing or in the opening of the metal casing.

7. The output noise reducing device according to claim 1, further comprising an enclosure in which the output line and the magnetic material core are housed with the connection terminal and the output terminal at the ends of the output line being exposed.

\* \* \* \* \*